United States Patent [19]
Nguyen et al.

[11] Patent Number: 5,594,370
[45] Date of Patent: *Jan. 14, 1997

[54] HIGH PERFORMANCE BACKPLANE DRIVER CIRCUIT

[75] Inventors: Trung Nguyen, San Jose; Anthony Y. Wong, Saratoga, both of Calif.

[73] Assignee: LSI Logic Corporation, Milpitas, Calif.

[*] Notice: The term of this patent shall not extend beyond the expiration date of Pat. No. 5,408,146.

[21] Appl. No.: 423,637

[22] Filed: Apr. 17, 1995

Related U.S. Application Data

[63] Continuation of Ser. No. 828,404, Jan. 31, 1992, Pat. No. 5,408,146.

[51] Int. Cl.$^6$ .................. H03K 19/0185; H03K 29/0948
[52] U.S. Cl. .................. 326/86; 326/30; 326/83; 326/115; 327/53
[58] Field of Search .................. 326/30, 86, 83, 326/114–115, 112, 119, 121; 327/53

[56] References Cited

U.S. PATENT DOCUMENTS

| | | | |
|---|---|---|---|
| 4,658,157 | 4/1987 | McGowan | 326/66 |
| 4,739,193 | 4/1988 | Doty, II | 326/83 |
| 4,937,476 | 6/1990 | Bazes | 326/71 |
| 5,023,488 | 6/1991 | Gunning | 326/86 |
| 5,038,058 | 8/1991 | Wang | 326/84 |
| 5,047,671 | 9/1991 | Suthar et al. | 326/30 |
| 5,148,056 | 9/1992 | Glass et al. | 326/87 |
| 5,408,146 | 4/1995 | Nguyen et al. | 326/86 |

OTHER PUBLICATIONS

Gunning et al. JEDEC; *GTL: A Low Voltage Swing Transmission Line Transceiver*, Mar. 15, 1991.
Chen, John Y. *CMOS Devices and Technology for VLSI*, Prentice Hall, 1990. pp. 312–317.
Weste et al, *Principles of CMOS VLSI Design*, Addison-Wesley, 1985, pp. 58–60, 109.
Nguyen et al, "A High Performance, Low Noise, Low Power, Backplane Driver Using 0.7μM BICMOS Technology". May 19, 1990.

Primary Examiner—Edward P. Westin
Assistant Examiner—Jon Santamauro
Attorney, Agent, or Firm—Poms, Smith, Lande & Rose

[57] ABSTRACT

A driver circuit formed from CMOS material is provided for receiving an input logic signal from an internal CMOS circuit and inducing a corresponding output signal onto a terminated transmission line. The driver circuit comprises a pre-driver inverter having an input and an output. The inverter inverts a logic state of the input logic signal. The driver circuit also includes an output transistor that provides the output signal and has a drain electrically connected to the transmission line. The driver circuit also includes a control circuit for controlling the output signal during a transition of the input logic signal from a first logic state to a second logic state. The driver circuit is physically isolated from the internal CMOS circuit.

23 Claims, 2 Drawing Sheets

HIGH PERFORMANCE BACKPLANE DRIVER CIRCUIT

CROSS-REFERENCE TO RELATED APPLICATIONS

This application is a continuation of U.S. patent application Ser. No. 07/828,404, filed Jan. 31, 1992, entitled "HIGH PERFORMANCE BACKPLANE DRIVER CIRCUIT" by Trung Nguyen, et al., now U.S. Pat. No. 5,408,146, issued Apr. 18, 1995.

BACKGROUND OF THE INVENTION

1. Field of the Invention

The present invention relates to driver circuits for interfacing digital circuits to transmission lines, and more particularly, to a high performance backplane driver for interfacing CMOS (complimentary metal oxide semiconductor) circuits to low impedance terminated transmission lines.

2. Description of Related Art

The advent of digital computers and the like has enabled numerous circuits to be interconnected for binary communication over single segment or multi-segment transmission lines. These transmission lines, commonly known as backplane busses, are often provided in the form of long traces on the backplanes of a printed circuit boards. A typical backplane data bus is shown in FIG. 4, having a transmission line with its-opposite ends terminated to a regulated voltage, $V_{tt}$, through termination resistors, $R_{tt}$. The circuits would each be provided on cards, which would communicate with the bus through connectors provided along the trace. Each of the circuits is typically provided with drivers, which receive logic signals from internal components of the circuits and are capable of delivering a predetermined voltage signal to the bus. Receivers are also provided, which are capable receiving the voltage signals on the bus produced by the drivers and converting them to logic signals for the internal components.

A significant problem with the backplane data bus is that as the circuits with their associated drivers are added to the bus, the impedance of the bus drops significantly. A typical bus backplane has an unloaded characteristic impedance of 1000. The capacitative loading of each external circuit which is added to the bus decreases the overall impedance of the bus. It is not uncommon for a fully loaded bus to have an impedance level between 200 to 300. This lower impedance requires the drivers to produce more drive current in order to maintain the appropriate signal voltage level on the bus. For example, TTL (transistor-transistor logic) components require voltage level swings of 3 v to 5 v in order to register changes in logic state. A typical driver using TTL components has a 50 mA output current rating, which is sufficient to pull down a 1000 load connected to 5 v. However, when the load has been reduced to 200, as in a fully loaded bus, the driver current requirement jumps to 250 mA. This current requirement is clearly beyond the limits of a TTL component, and would quickly burn out the driver.

Simply increasing the power output capability of the driver only makes the problem worse. Output drivers which are capable of providing the higher current also increase the capacitative loading on the bus. Thus, as the driver power is increased, the requirement for greater power also increases, resulting in a never ending cycle, and which also fails to solve the initial problem. Additionally, the high power drivers also suffer from greater noise and cross-talk, along with greater power consumption, rendering them undesirable as a solution to the backplane driver problem.

A proposed solution to the backplane driver problem was provided in the prior art by a driver developed by National Semiconductor Corporation. The prior art driver uses BTL (backplane transistor logic) technology, which provides signal level swings between 1.1 v and 2 v. The driver circuit, shown generally at 20 in FIG. 1, provides a Schottky diode 24 connected between the bus and the collector of a Schottky transistor 22. The emitter of the transistor 22 is connected to ground, and the base receives the input voltage. A nominal high voltage level (i.e., the logical "one" level) applied to the base causes the transistor 22 to conduct and provides a voltage differential across the diode 24, which consequently drops the signal on the transmission line to the nominal low level. Conversely, a nominal low voltage signal (i.e., the logical "zero" level) prevents the transistor 22 from conducting, which cuts off the flow of current through the diode 24. It should be apparent that when the driver 20 is not conducting, the maximum capacitance seen from the bus is limited to that of the reversed biased Schottky diode 24. The reduced capacitative loading maintains the bus impedance at close to the unloaded level and keeps the current requirement for the driver at a manageable level.

However, a problem with the prior art driver is its incompatibility with the TTL or CMOS components typically used in the external circuits. The differing kinds of components cannot be provided on a single integrated circuit since the components require different materials. The use of different component types also adds complexity to the circuit, and decreases the amount of available board space on the external circuit boards.

An additional problem with the BTL driver, as well as with other types of prior art drivers, is that of heat dissipation. The voltage swing which the driver must provide is directly related to the power which must be dissipated by the driver. The power is dissipated internally in the form of heat which must ultimately be removed from the circuit to prevent the circuit from overheating which can damage adjacent components on the circuit board. To reduce the heat dissipation requirement, it is necessary to minimize the driver's voltage swing requirement.

The use of CMOS technology is quite popular in the art, since CMOS circuits can be formed to relatively high gate densities. CMOS transistors configured with the drain directly connected to the bus would introduce very low capacitative load, and thus would be desirable for use in a backplane driver. However, CMOS circuits require a nominal 5 v voltage swing, which would be unacceptably high due to the power dissipation problem discussed above. In addition, the speed of the logic level changes in typical CMOS circuits would produce noise on the ground bus and on the backplane data bus.

Therefore, it would be desirable to provide a backplane driver which would introduce relatively low capacitative load to a terminated transmission line. It would be further desirable to provide a backplane driver utilizing relatively low voltage swings to minimize power dissipation. It would be still further desirable to provide a backplane driver which could be implemented in existing CMOS technology for interfacing with CMOS circuits.

SUMMARY OF THE INVENTION

Accordingly, a principal object of the present invention is to provide a backplane driver which would introduce relatively low capacitative load to a terminated transmission line.

Another object of the present invention is to provide a backplane driver utilizing relatively low voltage swings to minimize power dissipation.

Still another object of the present invention is to provide a backplane driver which could be implemented in existing CMOS technology for interfacing with CMOS circuits.

To achieve the foregoing objects, and in accordance with the purpose of this invention, the high performance backplane driver circuit of the present invention comprises a pre-driver circuit to invert an input signal, a control circuit to control the output low to high transition slew rate to reduce the output noise, and an open drain drive transistor to drive the signal onto an external transmission line.

In an embodiment of the present invention, a driver circuit formed from CMOS material is provided for receiving an input logic signal from internal CMOS components and inducing a corresponding output signal onto a terminated transmission line. The driver circuit comprises a pre-driver inverter having an input and an output, the inverter inverting a logic state of the input logic signal. The driver circuit also comprises an output transistor providing the output signal and having a drain electrically connected to the transmission line. The driver circuit also comprises a control circuit for controlling the output signal during a transition of the input logic signal from a first logic state to a second logic state. The driver circuit is physically isolated from the internal CMOS components.

Another embodiment of the present invention provides a driver/receiver circuit for receiving an input logic signal and inducing a corresponding signal onto a terminated transmission line and for receiving an output signal from the terminated transmission line and providing a corresponding output logic signal. The driver/receiver comprises a pre-driver inverter to invert a logic state of the input logic signal, a driver transistor providing the corresponding signal, a control circuit for controlling the corresponding signal during a transition of the input signal from a first logic state to a second logic state, a receiver transistor of P-channel type having a gate electrically connected to the transmission line, a source electrically connected to a voltage source, and a drain producing a current in relation to the received signal, a circuit for comparing a voltage level of the received signal to a reference voltage level and for splitting the current into a first path having a current inversely proportional to the received signal and a second path having a current in proportion to the received signal, and an output circuit for providing the CMOS logic signal at a binary 1 logic state when the current in the first path is greater than the current in the second path, and for providing the CMOS logic signal at a binary 0 logic state when the current in the first path is less than the current in the second path.

A more complete understanding of the high performance backplane driver circuit of the present invention will be afforded to those skilled in the art, as well as a realization of additional advantages and objects thereof, by a consideration of the following detailed description of the preferred embodiment. Reference will be made to the appended sheets of drawings which will be first described briefly.

DESCRIPTION OF THE PREFERRED EMBODIMENTS

The backplane bus common to digital computers and the like enables numerous circuits to be interconnected for binary communication. Each of the circuits are provided with drivers capable of delivering a predetermined voltage signal to the bus, and receivers capable of receiving the voltage signals on the bus produced by the drivers. There is a critical need to provide CMOS compatible drivers and receivers can provide low voltage logic swings while not increasing the capacitative load of the backplane bus.

Figure 4:
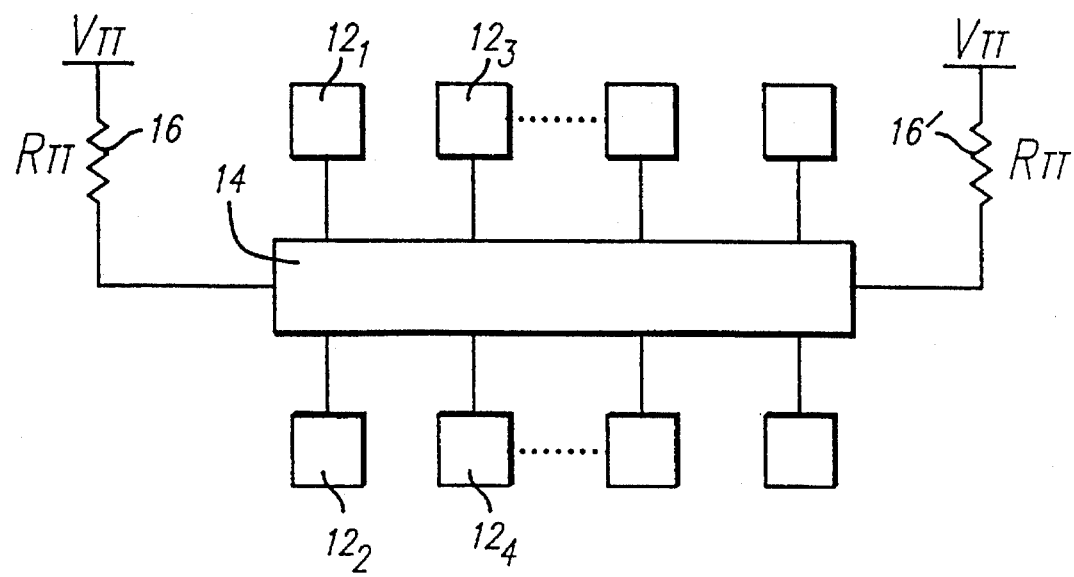
FIG. 4 shows a block diagram of a basic backplane bus.

Referring first to FIG. 4, there is shown a basic backplane bus, shown generally at 10, comprising a transmission line 14 and having termination resistors 16 and 16' positioned at opposite ends of the transmission line. A voltage source, $V_{tt}$, is provided on the opposite ends of each of the termination resistors 16, 16'. As denoted by the drawing, numerous circuits 12 can be connected to the transmission line 14 for binary communication between the circuits. As is well known in the art, bus 10 may comprise one of several similar buses which are formed together on the backplane of a printed circuit board, which forms a multiple bit bus. Such a multiple bit bus would be typically used to transmit multiple bit data, such as for a 16 bit or 32 bit wide data stream.

Figure 1:
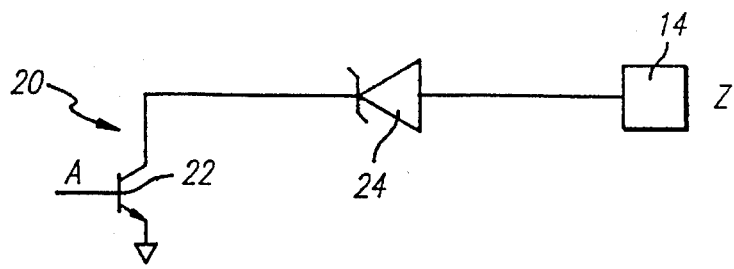
FIG. 1 is a schematic diagram of a prior art BTL driver.
Figure 2:
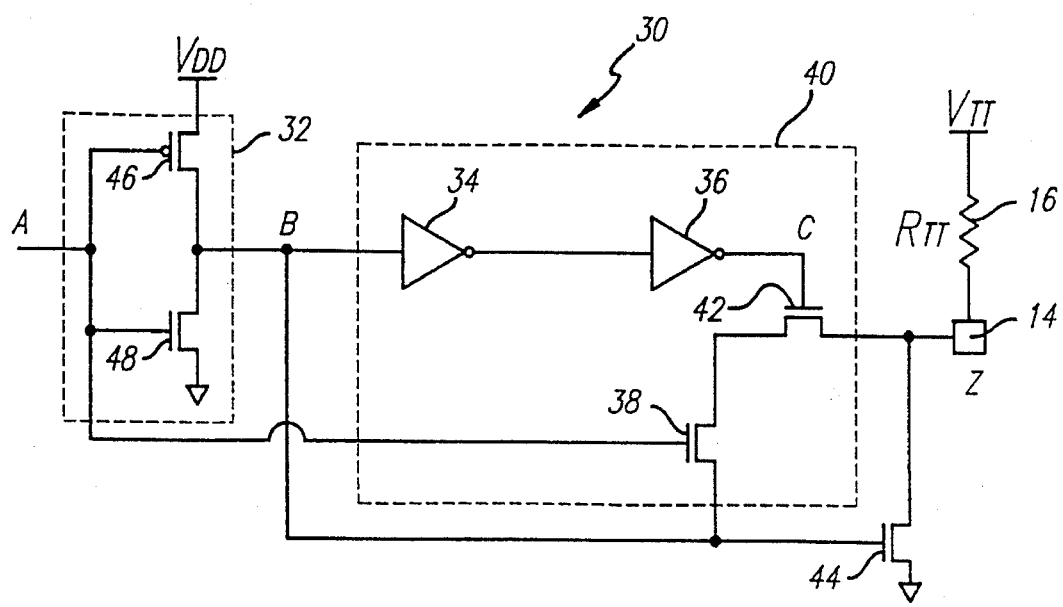
FIG. 2 is a schematic diagram of the backplane driver of the present invention.

In accordance with the present invention, each of the circuits 12 would be equipped with the backplane driver 30, schematically shown in FIG. 2. As will be further described below, the driver 30 is capable of placing a signal on bus 10 representing either a high ("1") or a low ("0") logic level, which can be interpreted by an associated receiver circuit 50, which will also be further described below.

The backplane driver 30 of the present invention receives an input signal A from one of the internal components of the circuits 12 described above. The input signal A can be either a low or a high logic level. The input signal A is first inputted into an inverter 32, which comprises a first inverting transistor 46 and a second inverting transistor 48. If the input signal is a high logic state, the transistor 48 will conduct, pulling the signal at node B to ground, or a low logic level. Conversely, if the input signal A is low, then the transistor 46 conducts, conducting power rail $V_{dd}$ to node B, bringing node B to a high logic level.

Node B is connected to the gate of an output transistor 44. A high logic level at node B causes the transistor 44 to conduct, and a low logic level at node B shuts off the transistor 44. With the transistor 44 in a conducting state, it shunts the transmission line 14 to ground, or to a low logic level. With the transistor 44 shut off, the voltage level at the transmission line 14 will float to the level of $V_{tt}$, or a high logic level.

A feedback control circuit 40 activates during the transition from a low logic level at input A to a high logic level. The control circuit 40 comprises a first control loop inverter 34, a second control loop inverter 36, a first control loop transistor 38, and a second control loop transistor 42. An input signal from node B is provided to the control loop inverters 34 and 36 which are connected in series, such that the signal from node B is inverted twice or back to its initial logic state. The resulting signal at node C is connected to the gate of the second control loop transistor 42. Input signal A is also connected to the gate of the first control loop transistor 38, with the drain of the first transistor 38 connected to the source of the second transistor 42. The drain of the second transistor 42 is connected to the transmission line 14. The source of the first control loop transistor 38 is connected to the node B.

Figure 3:
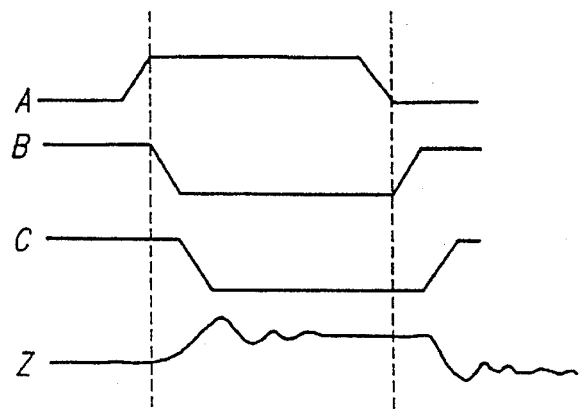
FIG. 3 is a logic timeline graph showing the logic level changes for nodes A, B, C, and Z during a transition from low-to-high and high-to-low input logic signal.

During steady state conditions when the input at node A remains constant, the logic level at node C is the same as that at node B. When input signal at node A is a logic low, node B is high, and the output z provided to the transmission line 14 is low. Transistor 38 is shut off, but the transistors 42 and 44 are conducting. As the input signal switches from low to high, the first transistor 38 starts to conduct. Upon reaching the threshold of the inverter 32, node B starts to go low and the output transistor 44 starts to turn off. The signal on the transmission line 14 begins pulling up to the high level corresponding with external voltage source $V_{tt}$. However, the rate of increase of the voltage level on the transmission line 14 is slowed due to the "on" state of both transistors 38 and 42 while the transistor 44 is turning off gradually. The slow rise time at the transmission line 14 minimizes the noise at the output. After a short period of time which is controlled by the delay induced by the inverters 34 and 36, the transistor 42 begins to shut off. FIG. 3 shows the change of state at nodes A, B, and C, and graphically demonstrates the effect of the delay provided by the inverters. Once the transistor 42 has stopped conducting, the feedback path is shut down and the circuit is in normal operation. The transition of the output signal on the transmission line 14 is depicted graphically as line Z in FIG. 3. As is apparent from the drawing, the ringing of the output signal quickly damps out due to the effect of the feedback control loop.

It should be apparent that with the output transistor 44 effectively shut off, the voltage level on transmission line 14 will rise to the external transmission line voltage $V_{tt}$. However, without the transistor 44 in a conductive state, the voltage level applied at the transmission line 14 is determined by the ratio of the source-drain resistance of the transistor 44 to the sum of that resistance plus the effective resistance of the parallel terminating resistors 16 and 16'. With a transmission line voltage of 1.2 volts, and the termination resistor 16 of 20 ohms, a low logic level signal on transmission line 14 would be approximately 0.4 volts. Therefore, it should be apparent that the backplane driver 10 of the present invention would produce a voltage swing between 1.2 and 0.4 volts. To implement the backplane driver 30 in a typical CMOS integrated circuit, the driver circuit 30 must be physically isolated from the internal components of the CMOS circuit. As commonly known in the art, CMOS components are highly susceptible to damage by current spikes, also known as "latchup." Under certain conditions in which P-channel and N-channel CMOS transistors are placed close together, abnormally high amounts of current can flow from $V_{dd}$ to ground through a transistor, causing the transistor to overheat. To address this problem, most CMOS circuits are provided with guard rings. The internal logic components of the CMOS circuit are provided within the guard rings, and the driver circuit 30, which communicates with the bus 10, is provided outside the guard rings. Although the schematic of the backplane driver 30 is not changed, the driver will not adequately function without this physical placement.

Figure 5:
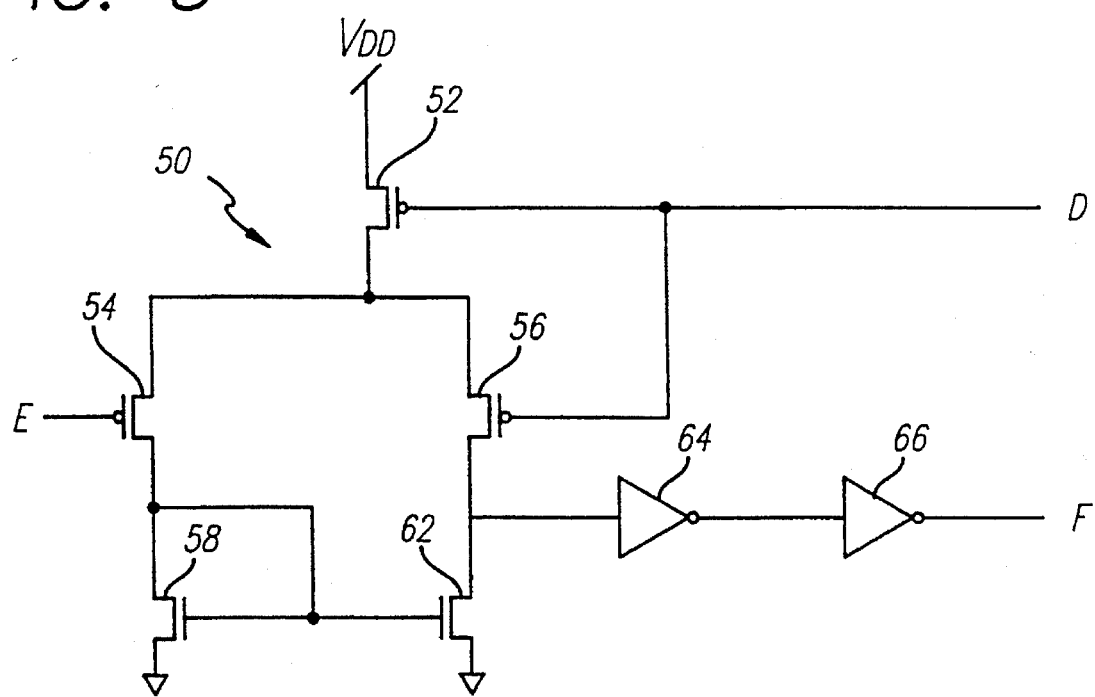
FIG. 5 is a schematic drawing of a receiver for operation with the backplane driver of the present invention.

Referring now to FIG. 5, there is shown a backplane receiver circuit 50. The backplane receiver 50 acts as a level translator, to convert the logic signal produced by backplane driver 30 to the 5 volt voltage swing required to interface with internal CMOS components.

The backplane receiver circuit 50 comprises a differential circuit which compares an input signal D received from the transmission line 14 to a reference voltage E. Reference voltage E is applied to the gate of a first left side differential transistor 54. It is anticipated that the reference voltage E be equal to 0.8 volts, which is the average of the voltage swing produced by the driver circuit 30. Input signal D from the transmission line 14 is applied to the gates of both an input transistor 52 and the first right side differential transistor 56. Each of the input transistor 52, the first left side differential transistor 54, and the first right side differential transistor 56 are of the P-channel type. The drain of the first left side differential transistor 54 is connected to both the drain and the gate of a second side differential transistor 58 and the gate of a second right side differential transistor 62. The source of the first left side differential transistor 54 is connected to both the source of the first right side differential transistor 56 and the drain of the input transistor 52. The sources of both the second left side differential transistor 58 and the second right side differential transistors 62 are connected to ground. The drain of the first right side differential transistor 56 is connected to the drain of the second right side differential transistor 62, and to a pair of inverters 64 and 66 connected in series. Output F from the second inverter 66 corresponds with the inverted logic state of input signal D received from the transmission line 14.

With input D at the low logic level from the transmission line 14, corresponding with approximately 0.4 volts, both the transistors 52 and 56 will be conducting at a moderate level. In contrast, the transistor 54 will be conducting at a much lower level, since the reference voltage at node E is greater than that at input D. The current flowing through the input transistor 52 is split, with a smaller percentage flowing through the first left side differential transistor 54 than through the first right side differential transistor 56. Since the input provided to the gates of both the transistor 58 and the transistor 62 is relatively low, each of the transistors above would be in a relatively low conducting state. Therefore, the signal at the drain of transistor 62 will be pulled towards a higher voltage, resulting in a high logic signal at output F. Conversely, if the input signal D is high, its voltage will be greater than that of the reference E, resulting in the transistors 62 and 58 turning on, and a low logic signal appearing at output F. Thus, it should be apparent that when the input at D is lower than the reference at E, a logic "1" appears at output F, and when the input D is greater than the reference at E, an output of logic "0" appears at output F.

It should be apparent to those skilled in the art that the circuits 12 could be equipped with backplane drivers 30 for transmit only operation, receivers 50 for receive only operation, or both drivers and receivers for two way communication with the bus.

Having thus described a preferred embodiment of a high performance backplane driver circuit, it should now be apparent to those skilled in the art that the aforestated objects and advantages for the within system have been achieved. It should also be appreciated by those skilled in the art that various modifications, adaptations, and alternative embodiments thereof may be made within the scope and spirit of the present invention. Accordingly, the invention is defined by the following claims.

We claim:

1. A backplane bus system, comprising:

a terminated bus line for signal transmission;

a plurality of electronic circuit units electrically connected to the terminated bus line, each of the electronic circuit units comprising:

a CMOS circuit; and a driver/receiver circuit for receiving an input logic signal from the CMOS circuit and for inducing a corresponding signal onto the terminated bus line and for receiving an output signal from the bus line and providing a corresponding output logic signal to the CMOS circuit, the driver/receiver circuit comprising:

a predriver inverter to invert a logic state of the input logic signal;

a driver transistor for providing the corresponding signal;

control means for controlling the corresponding signal during a transition of the input logic signal from a first logic state to a second logic state;

a receiver transistor of P-channel type having a gate electrically connected to the terminated bus line, a source electrically connected to a voltage source, and a drain for producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a binary 1 logic state when the current in the first path is greater than the current in the second path and for providing the CMOS logic signal at a binary 0 logic state when the current in the first path is less than the current in the second path.

2. The backplane bus system of claim 1, wherein the predriver inverter has an input and an output, and the driver transistor has a gate electrically connected to the predriver inverter output, a source electrically connected to ground and a drain electrically connected to the terminated bus line.

3. The backplane bus system of claim 2, wherein the control means further comprises:

a first control inverter having an input electrically connected to the predriver inverter output;

a second control inverter having an input electrically connected to the first control inverter output, the first and second control inverters providing a time delay;

a first control transistor having a gate electrically connected to the input logic signal, a source electrically connected to the predriver inverter [inverter]output, and a drain; and a second control transistor having a gate electrically connected to an output of the second control inverter, a source electrically connected to the first control transistor drain, and a drain electrically connected to the output transistor drains whereby the first control transistor is driven to conduction by the input logic signal before the output transistor begins to shut off, and the second control transistor begins to shut off after the time delay.

4. The backplane bus system of claim 3, wherein the first logic state corresponds to a binary "0", and the second logic state corresponds with a binary "1".

5. The backplane bus system of claim 4, wherein a difference between the output signal which corresponds to an input logic state of binary 1 and the output signal which corresponds to an input logic state of binary 0 is less than 1 volt.

6. The backplane bus system of claim 5, wherein the comparing means further comprises:

a first reference side differential transistor of P-channel type having a gate electrically connected to the reference signal, a source electrically connected to the input transistor drain;

a second reference side differential transistor having a gate and a drain both electrically connected to a drain of the first reference side differential transistor, and a source electrically connected to ground;

a first signal side differential transistor of P-channel type having a gate electrically connected to the bus line, a source electrically connected to the input transistor drain, and a drain electrically connected to the output means; and a second signal side differential transistor having a gate electrically connected to the second reference side differential transistor gate, a drain electrically connected to the first signal side differential transistor drain, and a source connected to ground.

7. The backplane bus system of claim 6, wherein the output means further comprises:

a first output inverter having an input electrically connected to the first signal side differential transistor drain; and a second output inverter having an input electrically connected to an output of the first output inverter, an output of the second output inverter providing the CMOS logic signal.

8. A backplane bus system, comprising:

a terminated bus line for signal transmission; and a plurality of circuit units which are electrically connected to the bus line, each of the circuit units comprising:

a CMOS circuit; and a receiver circuit for receiving a signal from the bus line and providing a corresponding CMOS logic signal to the CMOS circuit, the receiver circuit comprising:

an input transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path.

9. The backplane bus system of claim 8, wherein the comparing means further comprises:

a first reference side differential transistor of P-channel type having a gate electrically connected to the reference signal, and a source electrically connected to a drain of the input transistor;

a second reference side differential transistor having a gate and a drain both electrically connected to a drain of the first reference side differential transistor, and a source electrically connected to ground;

a first signal side differential transistor of P-channel type having a gate electrically connected to the bus line, a source electrically connected to the input transistor drain, and a drain electrically connected to the output means; and a second signal side differential transistor having a gate electrically connected to the second reference side differential transistor gate, a drain electrically connected to the first signal side differential transistor drain, and a source connected to ground.

10. The backplane bus system of claim 9, wherein the output means further comprises:

a first output inverter having an input electrically connected to the first signal side differential transistor drain; and a second output inverter having an input electrically connected to an output of the first output inverter, an output of the second output inverter providing the CMOS logic signal.

11. A backplane bus system, comprising:

a terminated bus line for signal transmission;

a plurality of circuit units which are electrically connected to the bus line, each of the circuit units comprising: a CMOS circuit; and a driver/receiver circuit for receiving an input logic signal from the CMOS circuit and inducing a corresponding signal onto the bus line and for receiving an output signal from the bus line and providing a corresponding output logic signal to the CMOS circuit, the driver/receiver circuit comprising:

a pre-driver inverter to invert a logic state of the input logic signal;

a driver transistor for providing the corresponding logic signal;

a control means for controlling the corresponding signal during a transition of the input signal from a first logic state to a second logic state;

a receiver transistor having a gate electrically connected to the bus line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path, and for providing the CMOS logic signal at a second logic state when the current in the first path is less than the current in the second path.

12. The backplane bus system of claim 11, wherein the predriver inverter has an input and an output, and the driver transistor has a gate electrically connected to the predriver inverter output, a source electrically connected to ground and a drain electrically connected to the bus line.

13. The backplane bus system of claim 12, wherein the control means further comprises:

a first control inverter having an input electrically connected to the predriver inverter output;

a second control inverter having an input electrically connected to the first control inverter output, the first and second control inverter providing a time delay;

a first control transistor having a gate electrically connected to the input logic signal, a source electrically connected to the predriver inverter output, and a drain; and a second control transistor having a gate electrically connected to an output of the second control inverter, a source electrically connected to the first control transistor drain, and a drain electrically connected to the output transistor drain, whereby the first control transistor is driven to conduction by the input signal before the output transistor begins to shut off, and the second control transistor begins to shut off after the time delay.

14. The backplane bus system of claim 13, wherein the first logic state corresponds to a binary "0", and the second logic state corresponds to a binary "1".

15. The backplane bus system of claim 14, wherein a difference between the signal which corresponds with an input logic state of binary "1"and the output signal which corresponds with an input logic state of binary "0"is less than 1 volt.

16. The backplane bus system of claim 15, wherein the comparing means further comprises:

a first reference side differential transistor of P-channel type having a gate electrically connected to the reference signal, and a source electrically connected to a drain of the receiver transistor;

a second reference side differential transistor having a gate and a drain both electrically connected to a drain of the first reference side differential transistor, and a source electrically connected to ground;

a first signal side differential transistor of P-channel type having a gate electrically connected to the bus line, a source electrically connected to the receiver transistor drain, and a drain electrically connected to the output means; and a second signal side differential transistor having a gate electrically connected to the second reference side differential transistor gate, a drain electrically connected to the first signal side differential transistor drain, and a source connected to ground.

17. The backplane bus system of claim 16, wherein the output means further comprises:

a first output inverter having an input electrically connected to the first signal side differential transistor drain; and a second output inverter having an input electrically connected to an output of the first output inverter, an output of the second output inverter providing the CMOS logic signal.

18. A driver/receiver circuit, comprising:

a driver for receiving an input logic signal from an internal CMOS circuit and inducing a corresponding signal onto a terminated transmission line; and a receiver for receiving an output signal from the terminated transmission line and providing a corresponding output logic signal to the internal CMOS circuit, the receiver comprising:

a receiver transistor of P-channel type having a gate electrically connected to the terminated transmission line, a source electrically connected to a voltage source, and a drain for producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a binary 1 logic state when the current in the first path is greater than the current in the second path and for providing the CMOS logic signal at a binary 0 logic state when the current in the first path is less than the current in the second path.

19. The driver/receiver circuit of claim 18, wherein the comparing means further comprises:

a first reference side differential transistor of P-channel type having a gate electrically connected to the reference signal, and a source electrically connected to the input transistor drain;

a second reference side differential transistor having a gate and a drain both electrically connected to a drain of the first reference side differential transistor, and a source electrically connected to ground;

a first signal side differential transistor of P-channel type having a gate electrically connected to the transmission line, a source electrically connected to the input transistor drain, and a drain electrically connected to the output means; and a second signal side differential transistor having a gate electrically connected to the second reference side differential transistor gate, a drain electrically connected to the first signal side differential transistor drain, and a source connected to ground.

20. The driver/receiver circuit of claim 19, wherein the output means further comprises:

a first output inverter having an input electrically connected to the first signal side differential transistor drain; and a second output inverter having an input electrically connected to an output of the first output inverter, an output of the second output inverter providing the CMOS logic signal.

21. A driver/receiver circuit, comprising:

a driver for receiving an input logic signal from an internal CMOS circuit and inducing a corresponding signal onto a terminated transmission line; and a receiver for receiving an output signal from the terminated transmission line and providing a corresponding output logic signal to the internal CMOS circuit, the receiver comprising;

a receiver transistor having a gate electrically connected to the terminated transmission line and producing a current in relation to the received signal;

comparing means for comparing a voltage level of the received signal to a reference voltage level and for splitting the current into a first path having a current inversely proportional to the received signal and a second path having a current in proportion to the received signal; and output means for providing the CMOS logic signal at a first logic state when the current in the first path is greater than the current in the second path and for providing the CMOS logic signal at a second logic state when the current in the first path is less than the current in the second path.

22. The driver/receiver circuit of claim 21, wherein the comparing means further comprises:

a first reference side differential transistor of P-channel type having a gate electrically connected to the reference signal, and a source electrically connected to a drain of the receiver transistor;

a second reference side differential transistor having a gate and a drain both electrically connected to a drain of the first reference side differential transistor, and a source electrically connected to ground;

a first signal side differential transistor of P-channel type having a gate electrically connected to the transmission line, a source electrically connected to the receiver transistor drain, and a drain electrically connected to the output means; and a second signal side differential transistor having a gate electrically connected to the second reference side differential transistor gate, a drain electrically connected to the first signal side differential transistor drain, and a source connected to ground.

23. The driver/receiver circuit of claim 22, wherein the output means further comprises:

a first output inverter having an input electrically connected to the first signal side differential transistor drain; and a second output inverter having an input electrically connected to an output of the first output inverter, an output of the second output inverter providing the CMOS logic signal.

* * * * *